United States Patent

Behlen

[15] 3,639,827

[45] Feb. 1, 1972

[54] CIRCUIT ARRANGEMENT FOR FORMING A VARIABLE REACTIVE IMPEDANCE

[72] Inventor: Horst Behlen, Wilferdingen, Germany

[73] Assignee: International Standard Electric Corporation, New York, N.Y.

[22] Filed: Aug. 26, 1970

[21] Appl. No.: 66,956

[52] U.S. Cl. ................................323/74, 323/93, 331/36 C

[51] Int. Cl. ......................................H03h 11/00, H03b 3/04

[58] Field of Search ........................307/320; 323/66, 74, 93; 331/36 C, 177 V; 332/30 V

[56] References Cited

UNITED STATES PATENTS

| | | | |
|---|---|---|---|
| 3,079,571 | 2/1963 | Elliott et al. | 307/320 X |
| 3,167,730 | 1/1965 | Anderson et al. | 307/320 X |
| 3,346,805 | 10/1967 | Hekimian | 323/74 |
| 3,443,205 | 5/1969 | Ludwig et al. | 323/74 |

*Primary Examiner*—A. D. Pellinen
*Attorney*—C. Cornell Remsen, Jr., Walter J. Baum, Paul W. Hemminger, Charles L. Johnson, Jr., Philip M. Bolton, Isidore Togut, Edward Goldberg and Menotti J. Lombardi, Jr.

[57] ABSTRACT

A circuit arrangement for forming a variable reactive impedance having at least two variable capacitance (varactor) diodes which are biased in the reverse direction. The value of the reactive impedance being almost linearly dependent upon the applied control voltage, and the varactor diodes, of which the first one is directly applied to the control voltage, are connected in series. A voltage divider is applied to a fixed voltage, for adjusting the remaining varactor diodes to predetermined capacitance values. To the base point of the voltage divider there is connected the first varactor diode and one pole of the source of control voltage.

4 Claims, 3 Drawing Figures

Figure 1A:
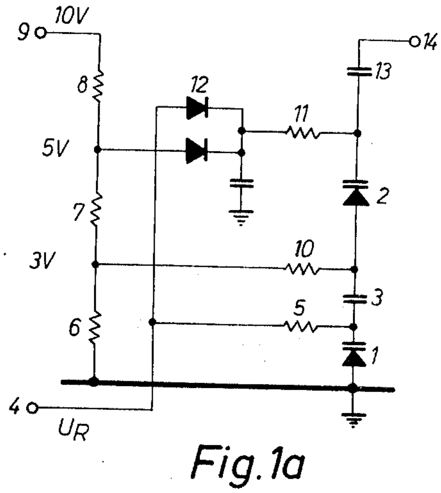

INVENTOR
HORST BEHLEN
BY
ATTORNEY

CIRCUIT ARRANGEMENT FOR FORMING A VARIABLE REACTIVE IMPEDANCE

The present invention relates to a circuit arrangement for forming a variable reactive impedance consisting of at least two varactor diodes which are biased in the reverse direction, and with the value of the reactive impedance being almost linearly dependent upon the applied control voltage.

Frequency and phase control circuits in which the fine tuning of an oscillator is effected by a varactor diode, cannot be dimensioned to the optimum with respect to the controlling transconductance and the regulation velocity, because the capacitance of the diode varies substantially more in the case of low control voltages, than in the case of high control voltages.

In order to achieve a linearization of the capacitance variation of a variable capacitance or varactor diode, it is known to apply the control voltage via a voltage divider containing a nonlinear resistor (German printed application DAS 1,186,518). To this end, however, it is necessary to provide a considerable control output which is available only in a few cases.

It is also possible to attach to the varactor diode a correcting member consisting of reactive impedances. These impedances must be balanced, and may have a detrimental effect upon the natural or inherent stability of the oscillator to be retuned. For this reason, such a solution is unsuitable for control circuits serving highly constant oscillators (cf. German Pat. application Off. Ser. No. 25,876 IX*d*/21*a*4, 14/01).

Moreover, there is known a circuit for readjusting the frequency of variable oscillators in which the frequency excursion is supposed to be kept constant throughout the frequency range, and which comprises two varactor diodes to which there are applied different control voltages (German printed application DAS 1,171,029). This circuit, however, is unsuitable for solving the problem on which the present invention is based.

Finally, it would be conceivable to cause a variation of the linear characteristic of the capacitance by adding series and parallel capacitances, as is described e.g., in the German technical journal "radio mentor" for Jan. 1951, on pages 022 to 025. By this, however, there is effected an excessive restriction of the already small capacitance variation of the retuning diode.

The present invention is based on the problem of providing a circuit arrangement for forming a variable reactive impedance (reactance) avoiding the disadvantages of the prior art circuits.

The invention is characterized by the fact that the varactor (variable capacitance) diodes, of which the first one is directly applied to the control voltage, are connected in series, that a voltage divider applied to a fixed potential, is provided for adjusting the remaining varactor diodes to predetermined capacitance values, and to the base point of which there is applied the first varactor diode and one pole of the source of control voltage, and that for each diode arranged subsequently to said first varactor diode, there is provided a threshold switch for applying the control voltage, with this switch causing a capacitance variation of the associated varactor diode to become effective as soon as the control voltage has exceeded the respective threshold value.

This circuit arrangement permits the representation of a variable reactive impedance consisting of varactor diodes, with the magnitude, variation and linearity thereof capable of being dimensioned extensively in accordance with the respective requirements.

Examples of embodiment of the inventive type of circuit arrangement will now be described hereinafter with reference to FIGS. 1*a*/*b* and 2.

FIG. 1*a* shows an example of embodiment comprising two varactor diodes.

Figure 1B:
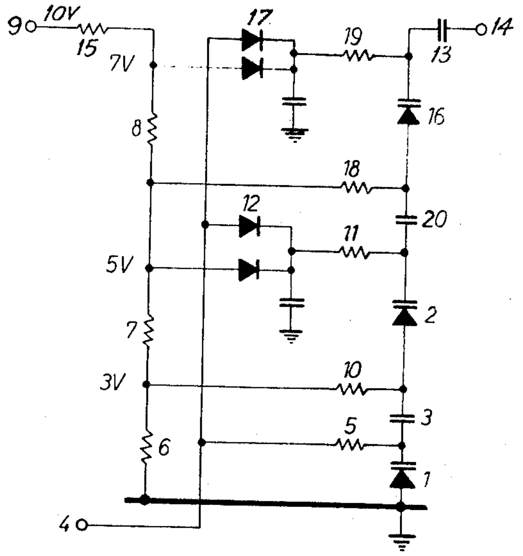

FIG. 1*b* shows an example of embodiment comprising three varactor diodes.

Figure 2:
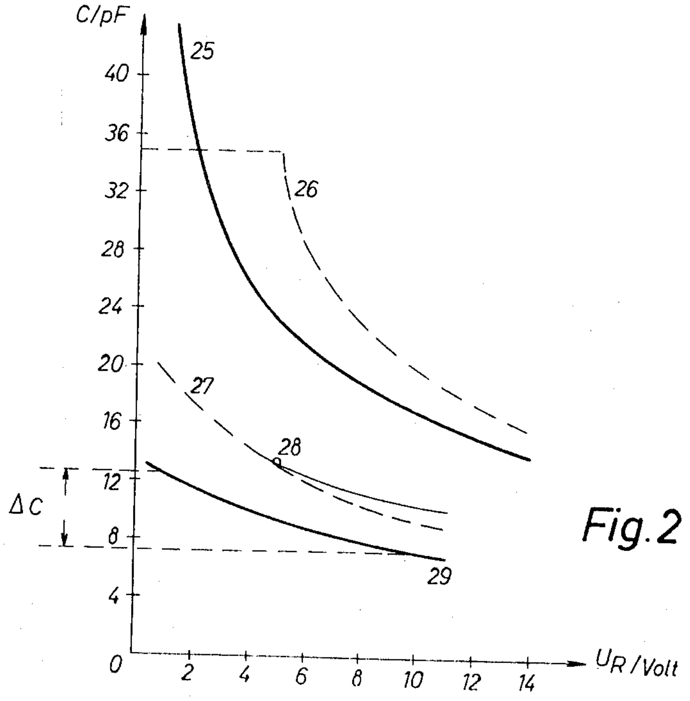

FIG. 2 shows characteristics relating to the example of embodiment according to FIG. 1*a*.

The circuit arrangement according to FIG. 1*a* comprises two varactor diodes 1 and 2 which are connected in series via a capacitor 3 serving to separate the control voltage circuits. The first varactor diode receives the control voltage $U_R$ from the terminal 4 directly via a decoupling resistor 5.

The characteristic relating to the capacitance variation of the diode 1 in dependence upon the control voltage $U_R$ is indicated by the reference numeral 25 in FIG. 2.

The circuit arrangement according to FIG. 1*a* also comprises a voltage divider consisting of the resistors 6, 7 and 8 which, via the terminal 9, is applied to a DC voltage of e.g., 10 volts. The voltage divider may be so dimensioned that a voltage of 3 volts will drop off across the resistor 6, and a voltage of 2 volts will drop off across the resistor 7.

The varactor diode is applied via the decoupling resistors 10 and 11, as well as via a diode of the threshold switch 12, to the resistor 7, and is thus biased in the reverse direction with 2 volts. The control voltage $U_R$ is applied to the other diode of the threshold switch 12. This voltage, however, is prevented from becoming effective as long as the control voltage $U_R$ has not exceeded the threshold value of 5 volts.

It may be taken from curve 26 in FIG. 2 that the capacitance of the diode 2 retains the value for a biasing potential of 2 volts until there is exceeded the threshold voltage value of 5 volts. The capacitance only drops thereafter in accordance with the difference voltage as applied to the diode 2.

The series capacitance as resulting from the varactor diodes 2 and the capacitor 3, is indicated in FIG. 2 by the curve 27. If the capacitance of the diode 2 were to remain constant, there would result the portion of curve 27 with a small capacitance variation as indicated by the through-going thin line as shown in FIG. 2. Since, however, in the case of a control voltage $U_R$ exceeding 5 volts, there is initiated the variation of the capacitance of diode 2, the curve 27 from point 28 onwards will extend in accordance with the continuation indicated by the dash line, with a higher transconductance. From this there will result with respect to the series connection, a greater capacitance variation and a reduced variation of transconductance.

For adapting the capacitance variation to the requirements of the control circuit, it is still possible to add a capacitor 13 effecting an additional linearization of the capacitance variation. In FIG. 2 the curve 29 indicates the variation of the total capacitance at the terminal 14 in dependence upon the control voltage $U_R$.

As may be taken from the example of embodiment according to FIG. 1*b*, in which identical parts are indicated by the same reference numerals as in FIG. 1*a*, the inventive type of circuit arrangement can also be built up by employing more than two varactor diodes. To this end there are added to the circuit according to FIG. 1*a*, a varactor diode 16, a threshold switch 17, a voltage-dividing resistor 15, a capacitor 20, and the decoupling resistors 18 and 19. The capacitances which have been left undesignated, are supposed to prevent RF voltages from entering the threshold switches.

According to the stated dimensioning of the voltage divider comprising the resistors 6, 7, 8 and 15, also the varactor diode 16, in the case of a low control voltage $U_R$, receives a constant voltage of 2 volts in the reverse direction. As soon as the control voltage has exceeded the value of 7 volts, the control voltage is applied via the threshold switch 7 and the decoupling resistor 19, to the varactor diode 16, so that also the capacitance thereof will drop in accordance with the difference voltage applied thereto. From this there will result an additional correction of the linearization relating to the variation of the total capacitance at terminal 14.

Considering that there is a great number of possibilities for selecting the capacitance diodes and for dimensioning the voltage-dividing resistors, the inventive type of circuit arrangement is of considerable versatility.

What is claimed is:

1. A circuit arrangement for forming a variable reactive impedance comprising:

a first and second varactor diode connected in series by a capacitor;

first means for coupling a control voltage to a junction between one terminal of said first diode and said capacitor;

a voltage dividing means coupled between a fixed potential and a base point common to both the other terminals of said first diode and one pole of said control voltage;

second means for coupling a bias voltage from said dividing means across said second diode, said second means including a diode of a threshold switch; and said threshold switch having another diode for applying said control voltage to said second varactor diode to cause a capacitive variation whenever said control voltage exceeds a predetermined threshold value.

2. The circuit of claim 1 including an additional capacitor coupled between said second diode and an output impedance terminal.

3. A circuit arrangement for forming a variable reactive impedance consisting of:

at least two variable capacitance diodes reverse biased and series connected by a capacitor, first means for coupling a control voltage across a first one of said diodes, a voltage dividing means coupled between a fixed potential and a base point common to both said first diode and one pole of said control voltage, second means coupled between said dividing means and an associate one of said variable diodes for adjusting said associate one to a predetermined capacitance, said second means including a diode of a threshold switch; and said threshold switch having another diode for applying said control voltage to said associated diode to cause a capacitance variation of said associated diode as soon as said control voltage has exceeded a predetermined threshold value.

4. The circuit of claim 3 including an additional capacitor coupled between a last one of said variable diodes and an output impedance terminal.

* * * * *